(12) United States Patent
Hitchcock et al.

(10) Patent No.: US 12,317,558 B2
(45) Date of Patent: May 27, 2025

(54) SEMICONDUCTOR SWITCHING DEVICE

(71) Applicant: GE AVIATION SYSTEMS LLC, Grand Rapids, MI (US)

(72) Inventors: Collin William Hitchcock, Clifton Park, NY (US); Stacey J. Kennerly, Niskayuna, NY (US); Ljubisa D. Stevanovic, Clifton Park, NY (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 543 days.

(21) Appl. No.: 17/692,489

(22) Filed: Mar. 11, 2022

(65) Prior Publication Data

US 2023/0290826 A1 Sep. 14, 2023

(51) Int. Cl.
| | | |
|---|---|---|
| H10D 62/10 | (2025.01) | |
| H10D 12/01 | (2025.01) | |
| H10D 30/65 | (2025.01) | |
| H10D 30/66 | (2025.01) | |
| H10D 62/13 | (2025.01) | |
| H10D 62/17 | (2025.01) | |
| H10D 62/832 | (2025.01) | |
| H10D 84/83 | (2025.01) | |

(52) U.S. Cl.
CPC ......... *H10D 62/127* (2025.01); *H10D 12/031* (2025.01); *H10D 30/65* (2025.01); *H10D 30/66* (2025.01); *H10D 62/364* (2025.01); *H10D 62/393* (2025.01); *H10D 62/8325* (2025.01); *H10D 84/83* (2025.01); *H10D 62/152* (2025.01); *H10D 62/157* (2025.01); *H10D 62/235* (2025.01)

(58) Field of Classification Search
CPC ............ H01L 29/0696; H01L 29/1095; H01L 29/1608; H01L 29/66068; H01L 29/7802; H01L 29/7395; H01L 29/0878; H01L 29/7816; H01L 29/1033; H01L 27/088; H01L 29/0856
See application file for complete search history.

(56) References Cited

U.S. PATENT DOCUMENTS

| | | |
|---|---|---|
| 6,084,266 A | 7/2000 | Jan |
| 6,630,379 B2 | 10/2003 | Mandelman et al. |

(Continued)

FOREIGN PATENT DOCUMENTS

| | | |
|---|---|---|
| CN | 1089949 A | 7/1994 |
| CN | 107251232 B | 10/2020 |

(Continued)

*Primary Examiner* — Joseph C. Nicely
*Assistant Examiner* — Alvin L Lee
(74) *Attorney, Agent, or Firm* — Fitch, Even, Tabin & Flannery LLP

(57) ABSTRACT

A semiconductor device cell includes a drift region having a first conductivity type, a well region having a second conductivity type disposed adjacent to the drift region, the well region defining a set of well region segments. A source region having the first conductivity type is disposed adjacent to the well region and surrounded by the well region. A channel region having the second conductivity type, and defining a set of channel region segments a periphery of the channel region segment being surrounded by the well region. The well region, source region, and channel region cooperatively define a first axial length extending across the surface.

20 Claims, 9 Drawing Sheets

(56) References Cited

U.S. PATENT DOCUMENTS

| | | |
|---|---|---|
| 7,956,384 B2 | 6/2011 | Mallikararjunaswamy |
| 9,716,144 B2 | 7/2017 | Bolotnikov et al. |
| 10,192,958 B2 | 1/2019 | Bolotnikov et al. |
| 10,937,870 B2 | 3/2021 | Bolotnikov et al. |
| 2015/0076521 A1 | 3/2015 | Tanaka |
| 2015/0084066 A1* | 3/2015 | Banerjee ............ H01L 29/8083 257/77 |
| 2016/0056242 A1 | 2/2016 | Masuda |
| 2018/0026127 A1* | 1/2018 | Morikawa ........... H01L 29/0688 257/329 |
| 2018/0175188 A1 | 6/2018 | Banerjee |
| 2020/0135717 A1 | 4/2020 | Takahashi et al. |
| 2021/0367039 A1* | 11/2021 | Ha ...................... H01L 29/7828 |
| 2022/0028976 A1 | 1/2022 | Wirths et al. |

FOREIGN PATENT DOCUMENTS

| | | |
|---|---|---|
| TW | 201601291 A | 1/2016 |
| WO | 201764887 A1 | 4/2017 |
| WO | WO-2018003064 A1 * | 1/2018 |

* cited by examiner

SEMICONDUCTOR SWITCHING DEVICE

BACKGROUND

Semiconductor devices, such as silicon carbide (SiC) power devices, are widely used in conventional electrical systems to switch or convert electrical power for consumption by a load. Many electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors). For example, MOSFETs can be fabricated as discrete transistor packages for high power applications, or as chips with millions of transistors. Many thousands of these transistor "cells" can be combined into one device in order to handle relatively high currents and voltages.

Many conventional MOSFETs use a vertical structure with source and drain terminals at opposite sides of a chip. The vertical orientation eliminates crowding at the gate and offers larger channel widths. Generally, when a semiconductor device is conducting current, the on-state resistance of the device represents its conduction loss, which impacts the efficiency of the device and its cost. That is, conventional semiconductor device cells include a number of internal components that can create resistance to the current flowing through the device.

DETAILED DESCRIPTION

Figure 1:
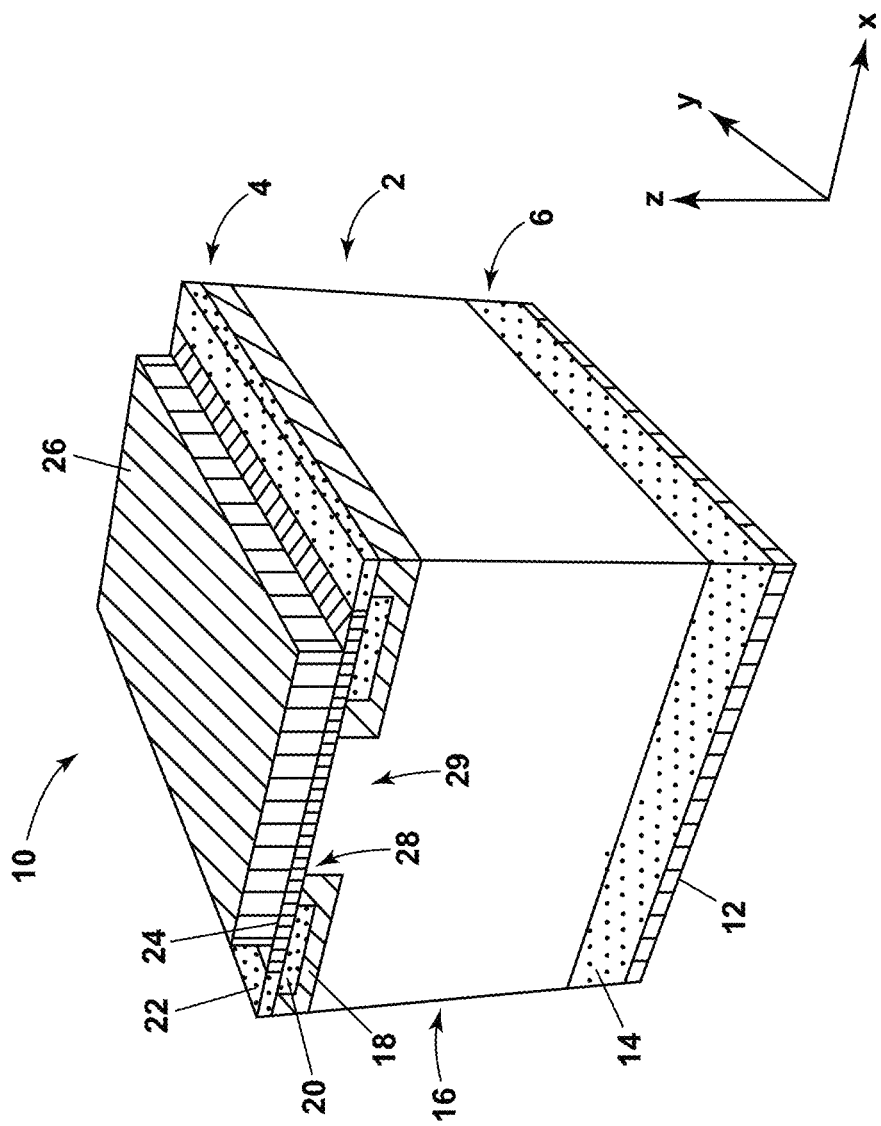
FIG. 1 is a schematic of a typical planar MOSFET device.

Aspects of the disclosure can be implemented in any environment, apparatus, or method for cooling a heat-generating module regardless of the function performed by the heat-generating module.

As used herein, the term "set" or a "set" of elements can be any number of elements, including only one. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one aspect" or "an aspect" of the present disclosure are not intended to be interpreted as excluding the existence of additional aspects that also incorporate the recited features. It may be appreciated that the shapes, positions, and alignments of features presently disclosed are, for the sake of simplicity, illustrated and described as being relatively ideal (e.g., square, rectangular, and hexagonal cells and shielding regions with perfectly straight and aligned features). However, as may be appreciated by one of skill in the art, process variations and technical limitations may result in cellular designs with less than ideal shapes or irregular features may still be in accordance with the present disclosure. As such, the term "substantially" as used herein to describe a shape, a position, or an alignment of a feature is meant to encompass ideal or target shapes, positions, and alignments as well as imperfectly implemented shapes, positions, and alignments resulting from variability in the semiconductor fabrication process, as may be appreciated by one skilled in the art.

Additionally, semiconductor device cells are described herein as being disposed or fabricated "at the surface," "in the surface," "on the surface," or "along the surface" of a semiconductor layer, which is intended to include semiconductor device cells having portions disposed within the bulk of the semiconductor layer, portions disposed proximate to the surface of the semiconducting layer, portions disposed even with the surface of the semiconductor layer, and/or portions disposed above or on top of the surface of the semiconductor layer.

While terms such as "voltage", "current", and "power" can be used herein, it will be evident to one skilled in the art that these terms can be interrelated when describing aspects of the electrical circuit, or circuit operations.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. The exemplary drawings are for purposes of illustration only and the dimensions, positions, order and relative sizes reflected in the drawings attached hereto can vary.

As used herein, a controllable switching element, or a "switch" is an electrical device that can be controllable to toggle between a first mode of operation, wherein the switch is very low resistance state or in an "ON" state, or otherwise in a conducting mode, intending to transmit current from a switch input to a switch output, and a second mode of operation, wherein the switch is very high resistance state or in an OFF state, or otherwise in a non-conducting mode, intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

Furthermore, for ease of description and understanding, while various aspects may be discussed below in the context of SiC MOSFET devices, it should be appreciated the present approach may be applicable to other types of MOSFETS, such as, but not limited to SiC DMOSFETs, UMOSFETs, and VMOSFETs. It is contemplated that various material systems (e.g., silicon (Si), germanium (Ge), aluminum nitride (AlN), gallium nitride (GaN), gallium arsenide (GaAs), diamond (C), or any other suitable wide band-gap semiconductor) can be used. It is further contemplated that other types of device structures (e.g., UMOSFET, VMOSFETs, insulated gate bipolar transistors (IGBT), insulated base MOS-controlled thyristors (IBMCT), or any other suitable FET and/or MOS device)) utilizing n-channel or p-channel designs can be used in various non-limiting aspects.

One of the most common solid-state semiconductor switching devices used in modern power electronics is the MOSFET device. While an ideal switch would conduct electrical current with zero electrical resistance when in a low resistance "ON" or conducting state, a MOSFET will always exhibit a finite electrical resistance. Thus, it is generally desirable to reduce the total resistance (e.g., an on-state resistance) to the minimum possible value. It is also desirable to minimize the ON-state resistance of the MOSFET, without reducing the OFF-state resistance, the switching speed of the device, or both.

Conventional MOSFETs typically consist of arrays of periodic unit cells. Each unit cell can have a respective electrical resistance, and the MOSFET on-state electrical resistance can be defined by the sum of the respective cell resistances in a parallel electrical circuit. Additionally, each unit cell resistance can be defined by a set of respective resistance values of the structural components of the cell coupled in series. The on-state resistance of a particular MOSFET can thus be defined based at least in part on the relative geometric structures of the various functional components within the respective cells.

When a MOSFET is in an ON or conducting state, electrons flow through each individual cell from a "source metal" on the top surface of a SiC semiconductor body, through various structures defined within the SiC semiconductor body, and into a "drain metal" on the back surface of the body. Each respective MOSFET unit cell surface can include four mutually exclusive, non-overlapping regions referred to herein as the source contact region, the n+/p-well region, and the channel/accumulation region (CHAN) and the JFET region. The four regions can be coupled electrically in series, and can occupy substantially the entire area of the respective cell.

The resistive contributions of the source contact and the CHAN regions to the on-state electrical resistance of the MOSFET are inversely proportional to their respective areas. The resistive contribution of the n+/p-well region to the on-state electrical resistance of the MOSFET is roughly directly proportional to its area. Since the resistive contribution of the CHAN region is relatively greater than that of the n+/p-well, or the source contact region, the on-state electrical resistance of the MOSFET can be reduced by maximizing the relative area of the CHAN region in the unit cell with respect to the n+/p-well, or the source contact region. Thus, conventional techniques typically employ MOSFET structures with a maximized relative proportion of the CHAN region area by arranging the cell geometries to minimize the relative proportion of the n+/p-well region area, or the source contact region area, or both, with respect to the CHAN region.

However, for SiC MOSFETs, current fabrication technology can limit such optimization. For example, conventional techniques have focused on reducing MOSFET on-state resistance using periodic cells produced by surrounding a minimum size source contact region with a minimum size n+ region, relative to the CHAN region. However, the minimum fabricable source contact region dimensions (using conventional fabrication techniques) can be larger than a calculated or determined optimized area. Furthermore, the CHAN region must be separated from the source contact region by a minimum width of the n+/p-well region to avoid fabrication-related device failure. Notably, however, the geometry of the n+/p-well region is relatively unconstrained by such fabrication concerns.

Accordingly, as described in more detail herein, in non-limiting aspects, the cells can be arranged to minimize the relative proportion of the n+/p-well region area, while minimally increasing the source contact region area and the CHAN region area. In this way, aspects as described herein can thereby arrange a greater net relative proportion of the CHAN region area with respect to the source contact region or size n+ region, or both, compared to conventional techniques, and thereby achieve an improved (i.e., lower) on-state resistance for the respective cell than conventional devices.

For example, non-limiting aspects can employ a cellular structure comprising an array of cells spaced further apart than conventional devices. The resultant increased space or area between adjacent cells can comprise alternating bands or segments of n+/p-well and CHAN regions. With this novel arrangement, the relative proportion of the CHAN region with respect to the n+/p-well, or the source contact region, or both, can advantageously be increased beyond the level achievable using conventional techniques that increase the relative proportion of the CHAN area by minimizing the n+/p-well, or the source contact region, or combinations thereof. As will be described in more detail herein, an undesirable increase in on-state resistance resulting from the increased area of the n+/p-well region (e.g., in the alternating bands), can be negated or overcome within a predetermined dimensional range, due to the decrease in on-state resistance achieved by the corresponding increased area of the CHAN region, thereby resulting in a net decrease in the on-state resistance of the respective cell compared to conventional designs.

FIG. 1 illustrates an active cell of a conventional planar n-channel field-effect transistor, such as a DMOSFET, hereinafter MOSFET device 10. It may be appreciated that, in order to more clearly illustrate and describe certain components of the MOSFET device 10, as well as other devices discussed hereinbelow, certain commonly understood design elements (e.g., top metallization, passivation, edge termination, and so forth) may be omitted.

The illustrated conventional MOSFET device 10 of FIG. 1 includes a semiconductor layer 2 (e.g., an epitaxial SiC semiconductor layer) having a first surface 4 and a second surface 6. The semiconductor layer 2 includes a drift region 16 having a first conductivity type (e.g., an n-type drift region 16), a well region 18 having a second conductivity type (e.g., a p-well region 18) disposed adjacent to the drift region 16 and proximal to the first surface 4. The semiconductor layer 2 also includes a source region 20 having the first conductivity type (e.g., an n-type source region 20) adjacent to the well region 18 and proximal to the first surface 4. A dielectric layer 24 (also referred to as a gate insulating layer or gate dielectric layer) is disposed on a portion of the first surface 4 of the semiconductor layer 2, and a gate electrode 26 is disposed on the dielectric layer 24. The second surface 6 of the semiconductor layer 2 is a substrate layer 14 (e.g., a SiC substrate layer), and the drain contact 12 is disposed on the bottom of the MOSFET device 10 along the substrate layer 14. A source contact 22 is disposed on top of the semiconductor layer 2, partially covering source region 20 and well region 18.

During on-state operation, an appropriate gate voltage (e.g., at or beyond a threshold voltage ($V_{TH}$) of the MOSFET device 10) can cause an inversion layer to be formed in a channel region 28, as well as a conductive path to be enhanced in a junction field-effect transistor (JFET) region 29 due to accumulation of carriers, allowing current to flow from the drain contact 12 (i.e., the drain electrode) to the source contact 22 (i.e., the source electrode). It should be appreciated that, for the MOSFET devices discussed herein, the channel region 28 may be generally defined as an upper portion of the well region 18 disposed below the gate electrode 26 and the dielectric layer 24.

Figure 2:
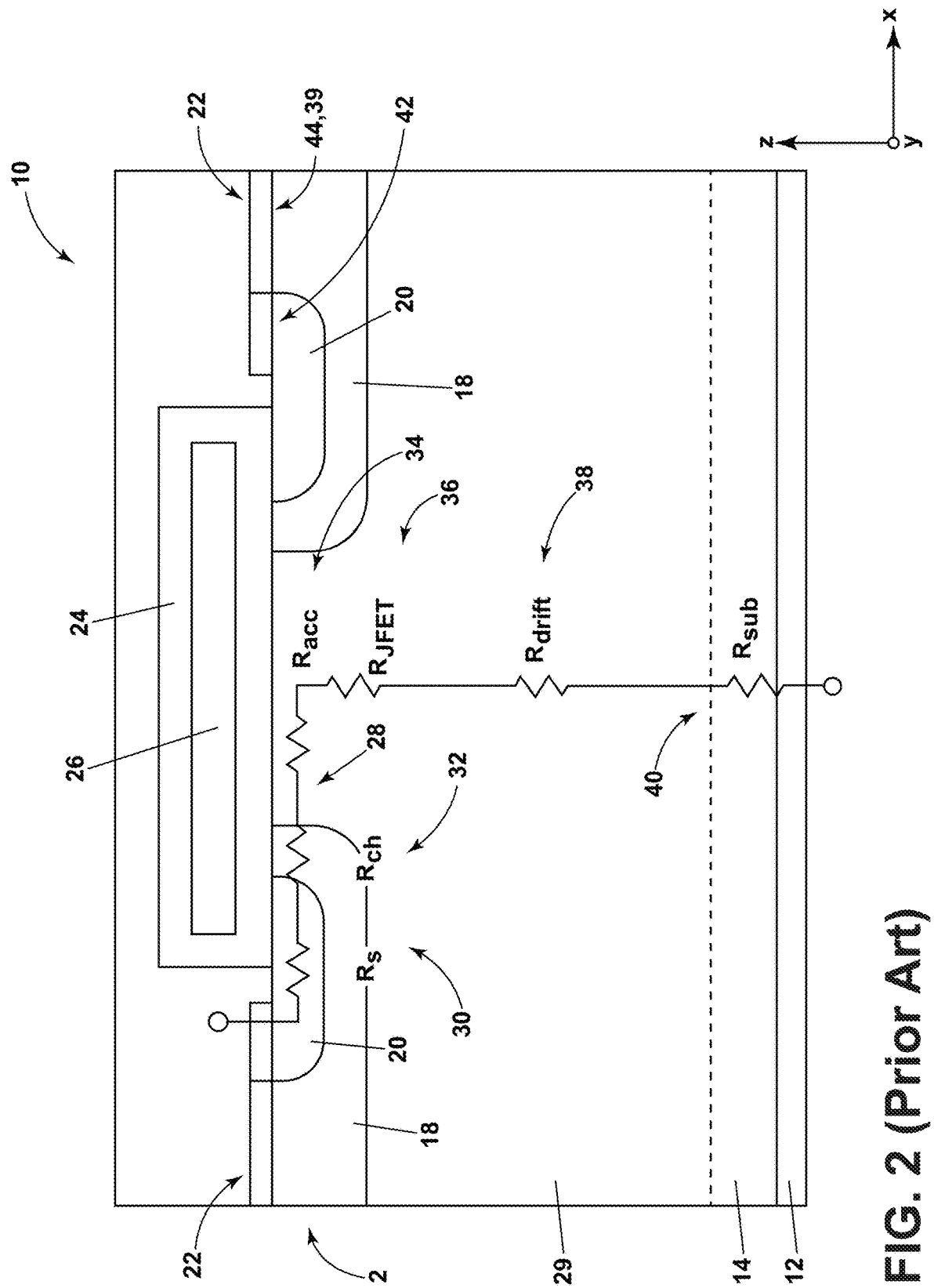
FIG. 2 is a schematic illustrating resistance for various regions of a typical MOSFET device.

FIG. 2 is a schematic cross-sectional view of the conventional MOSFET device 10 of FIG. 1. The source contacts 22 of the MOSFET device 10 illustrated in FIG. 2 generally provide an ohmic connection to the source electrode, and are disposed over both a portion of the source regions 20 and a portion of the well regions 18. The source contact 22 is generally a metallic interface comprising one or more metal layers situated between these semiconductor portions of the MOSFET device 10 and the metallic source electrode. For clarity, the portion of the source region 20 (e.g., an n+source region 20) of the MOSFET device 10 disposed below the source contact 22 may be more specifically referred to herein as a source contact region 42 of the MOSFET device 10. Similarly, a portion of the well region 18 (e.g., a p-well region 18) of the MOSFET device 10, which may be p+ doped at a higher level than the remainder of the well region 18, may be more specifically referred to herein as a body region 44 (e.g., p+ body region 44) of the MOSFET device 10. For clarity, the portion of the body region 44 that is disposed below (e.g., covered by, directly electrically connected to) the source contact 22, may be more specifically referred to herein as a body contact region 44 (e.g., p+ body contact region 44) of the MOSFET device 10. For consistency, portions of the source contact 22 may be designated herein based on the portion of the semiconductor device that is disposed below the source contact 22. For example, the portion of the source contact 22 disposed above a body contact region 44 may be referred to herein as the body contact portion of the source contact 22. Similarly, the portion of the source contact 22 disposed above a source contact region 42 of the MOSFET device 10 may be referred to herein as a source contact portion of the source contact 22.

As illustrated schematically in FIG. 2, the various regions of the MOSFET device 10 may each have an associated resistance, and a total resistance (e.g., an on-state resistance, Rds(on)) of the MOSFET device 10, which may be represented as a sum of each of these resistances. For example, as illustrated in FIG. 2, on-state resistance, Rds(on), of the MOSFET device 10 may be approximated as a sum of: a resistance Rs 30 (e.g., a resistance of source region 20 and a resistance of the source contact 22); a resistance Rch 32 (e.g., an inversion channel resistance of the channel region 28 illustrated in FIG. 2); a resistance Racc 34 (e.g., a resistance of an accumulation layer between the dielectric layer 24 and portion of drift region 16 located between well regions 18); a resistance RJFET 36 (e.g., resistance of undepleted neck region between well regions 18); a resistance Rdrift 38 (e.g., the resistance about the drift region 16); and a resistance Rsub 40 (e.g., the resistance about the substrate layer 14). Note that the resistances illustrated in FIG. 2 are not intended to be exhaustive, and that other resistances (e.g., drain contact resistance, spreading resistance, etc.) could potentially be present within the MOSFET device 10.

In certain cases, one or two resistance components illustrated in FIG. 2 may dominate conduction losses of the MOSFET device 10, and addressing these factors can significantly impact Rds(on). For example, for devices in which the drift resistance 38, the substrate resistance 40 and the contact resistance are negligible, such as low-voltage devices or devices suffering from low inversion layer mobility (e.g. SiC devices), the channel resistance (Rch 32) may account for a significant portion of device conduction losses.

By further example, in medium-voltage and high-voltage devices, JFET region resistance (RJFET 36) may account for a significant portion of total conduction losses. In some cases, the MOSFET channel and JFET can comprise approximately 55% of a typical semiconductor device on-state resistance.

Figure 3:
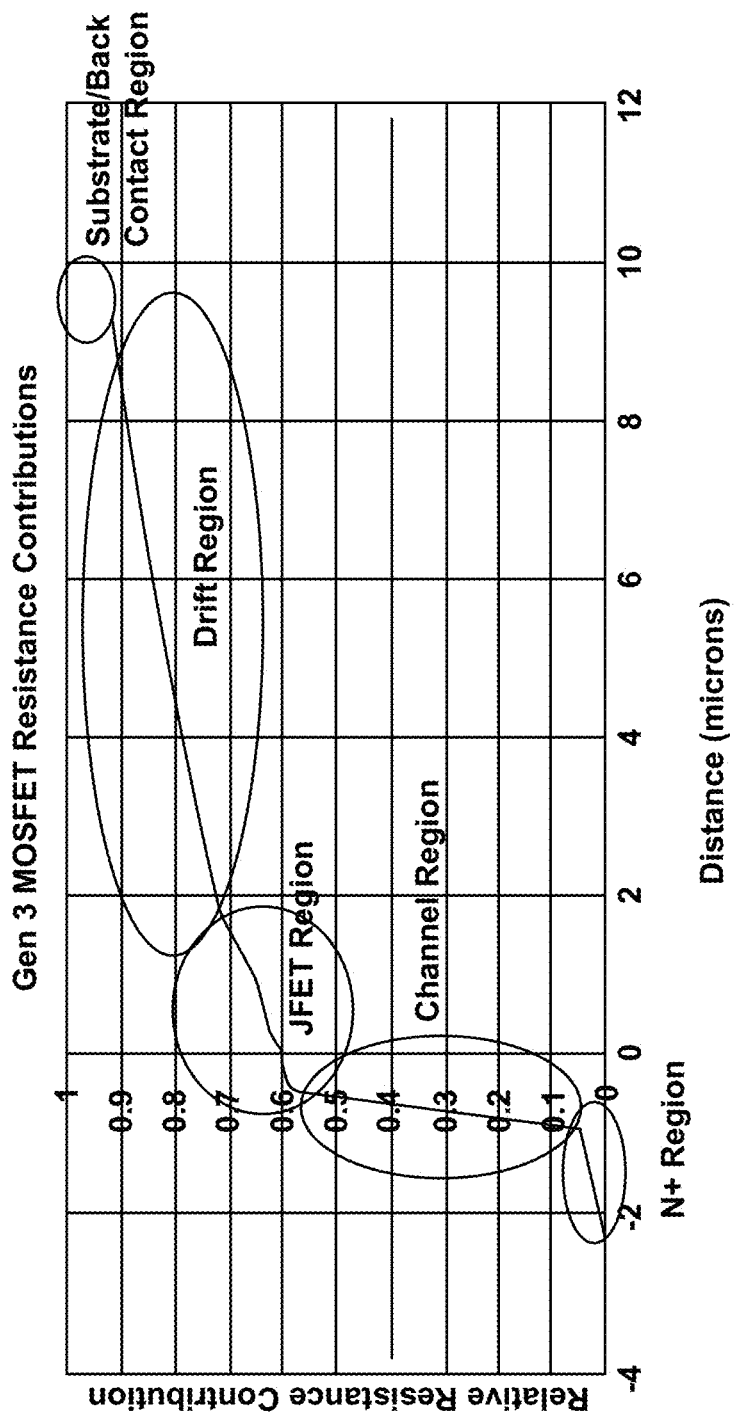
FIG. 3 is a chart depicting the relative resistance contributions of the regions of the MOSFET device structure of FIG. 2.

With reference to FIG. 3, a chart depicting an example of the relative resistance contributions of the various regions of the MOSFET device structure of FIG. 2 is illustrated. The relative resistance for each region is depicted as a function of the respective region distance (e.g., path length). It can be seen that the inversion channel resistance Rch 32 of the channel region 28 can be the largest contributor to the on-state resistance Rds(on) of the MOSFET device 10, while the resistance Rs 30 (e.g., a resistance of source region 20 and a resistance of the source contact 22), and substrate or back contact region resistance Rsub 40 (e.g., the resistance about the substrate layer 14), contribute the least resistance to the on-state resistance Rds(on) of the MOSFET device 10.

Figure 4:
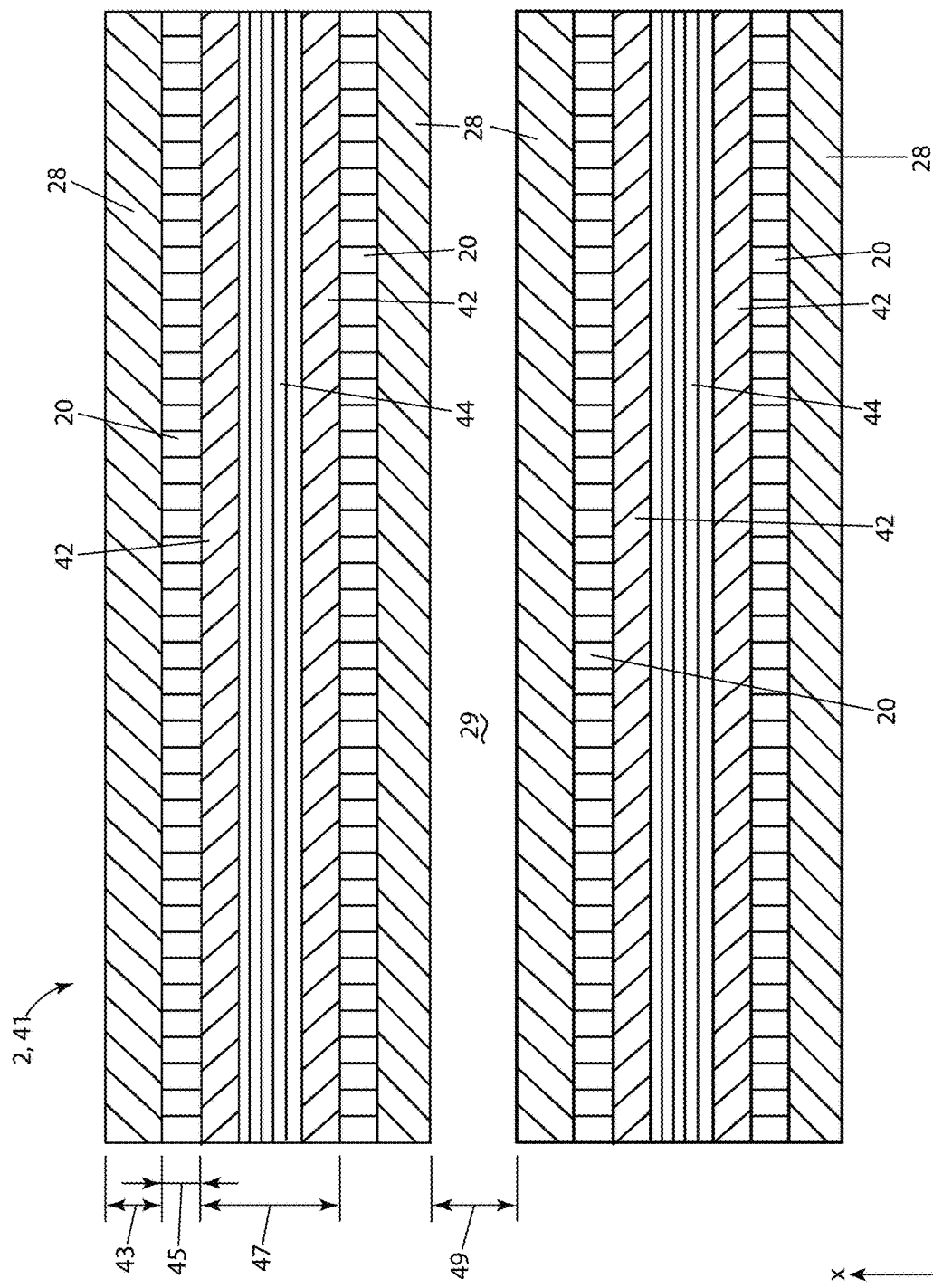
FIG. 4 is a top-down view of a surface of a SiC layer that includes a typical MOSFET device structure having a stripe cell layout.

FIG. 4 illustrates a top-down view of a conventional semiconductor layer 2 including a MOSFET device structure 41 having a conventional stripe cell layout. (i.e., a non-cellular layout). The illustrated stripe layout of FIG. 4 includes: the channel regions 28, source regions 20, source contact regions 42, body contact regions 44, and JFET region 29. It may be appreciated that a set of source contact regions 42 and a set of body contact regions 44 can be formed as continuous stripes along the surface of the semiconductor for the illustrated stripe layout of FIG. 4. In terms of dimensions, the conventional MOSFET device structure 41 may be described as having a particular channel length (Lch) 43, a distance from channel region 28 to ohmic region (Lch-to-ohm) 45, a width of the ohmic region (Wohm 47), and a width of the JFET region (WJFET) 49. While the conventional stripe cell layout illustrated in FIG. 4 offers good reliability (e.g., long term and high temperature performance), the relatively high channel resistance (Rch) 32 and JFET resistance (RJFET) 36 of the MOSFET device structure 41 results in a relatively high Rds(on), which diminishes the electrical performance of the device.

Figure 5:
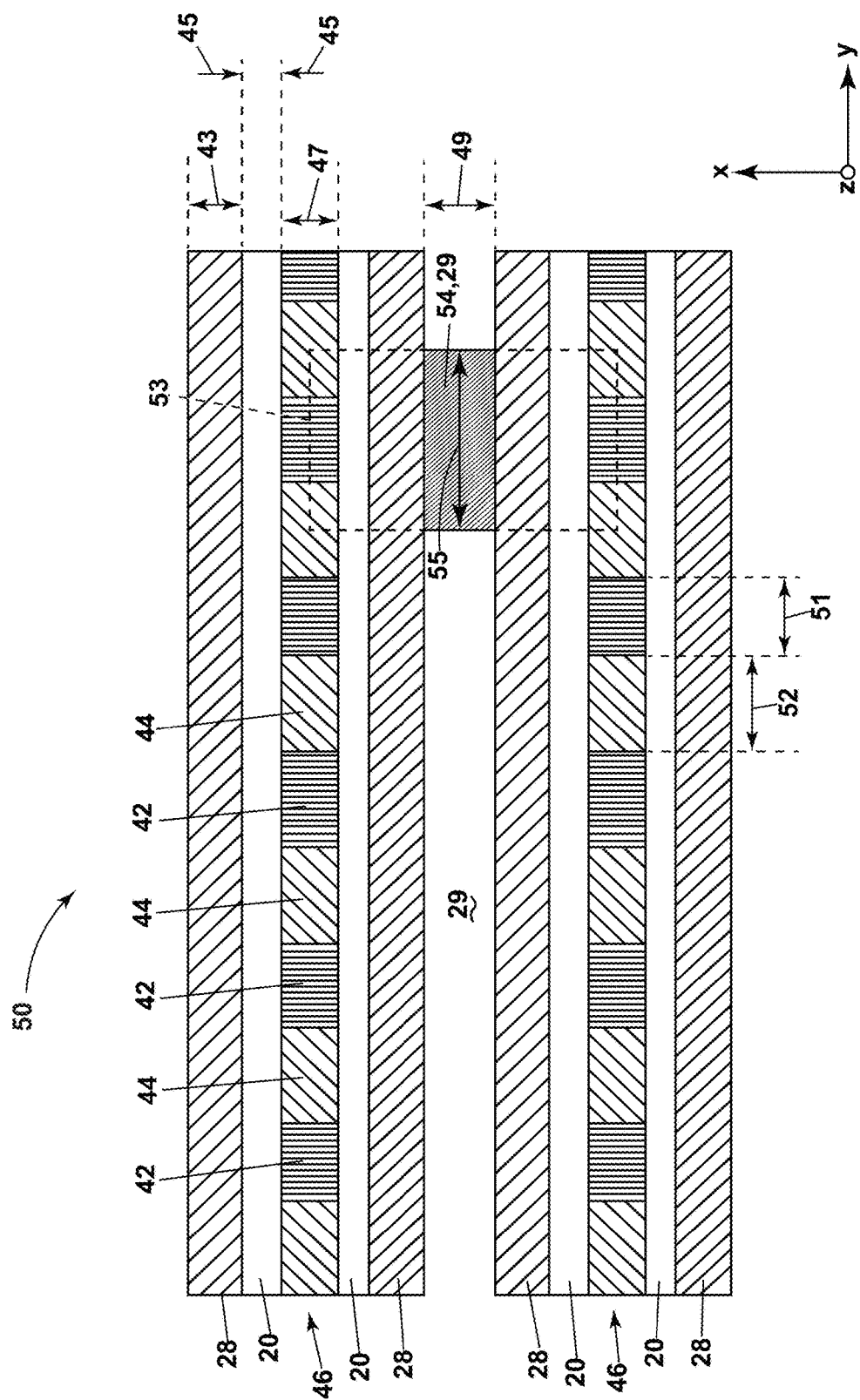
FIG. 5 is a top-down view of a surface of a SiC layer that includes a typical MOSFET device structure having a stripe cell layout.

An example of another conventional device layout is illustrated in FIG. 5, which is a top-down or plan view of a stripe ladder device layout 50 (i.e., a non-cellular layout) with segmented source/body contacts. The illustrated stripe ladder device layout 50 includes: channel regions 28, source regions 20, a set of segmented source/body contacts 46 (including a body contact region 44 and the source contact region 42) and JFET region 29. FIG. 5 further illustrates dimensions of the stripe ladder device layout 50, including:

channel length (Lch) 43, distance from the channel to the ohmic region (Lch-to-ohm) 45, width of the ohmic region (Wohm) 47, width of the JFET region (WJFET) 49, length of the source contact region segment (Ln) 51, length of the body contact region segment (Lp) 52, subset of device area (Acell 53 represented by the dashed rectangle 53), JFET area within Acell 53 (ANET 54 represented by the cross-hatched area 54), and width of the channel (Wch) 55 within Acell 54 for the illustrated stripe ladder device layout 50.

Figure 6:
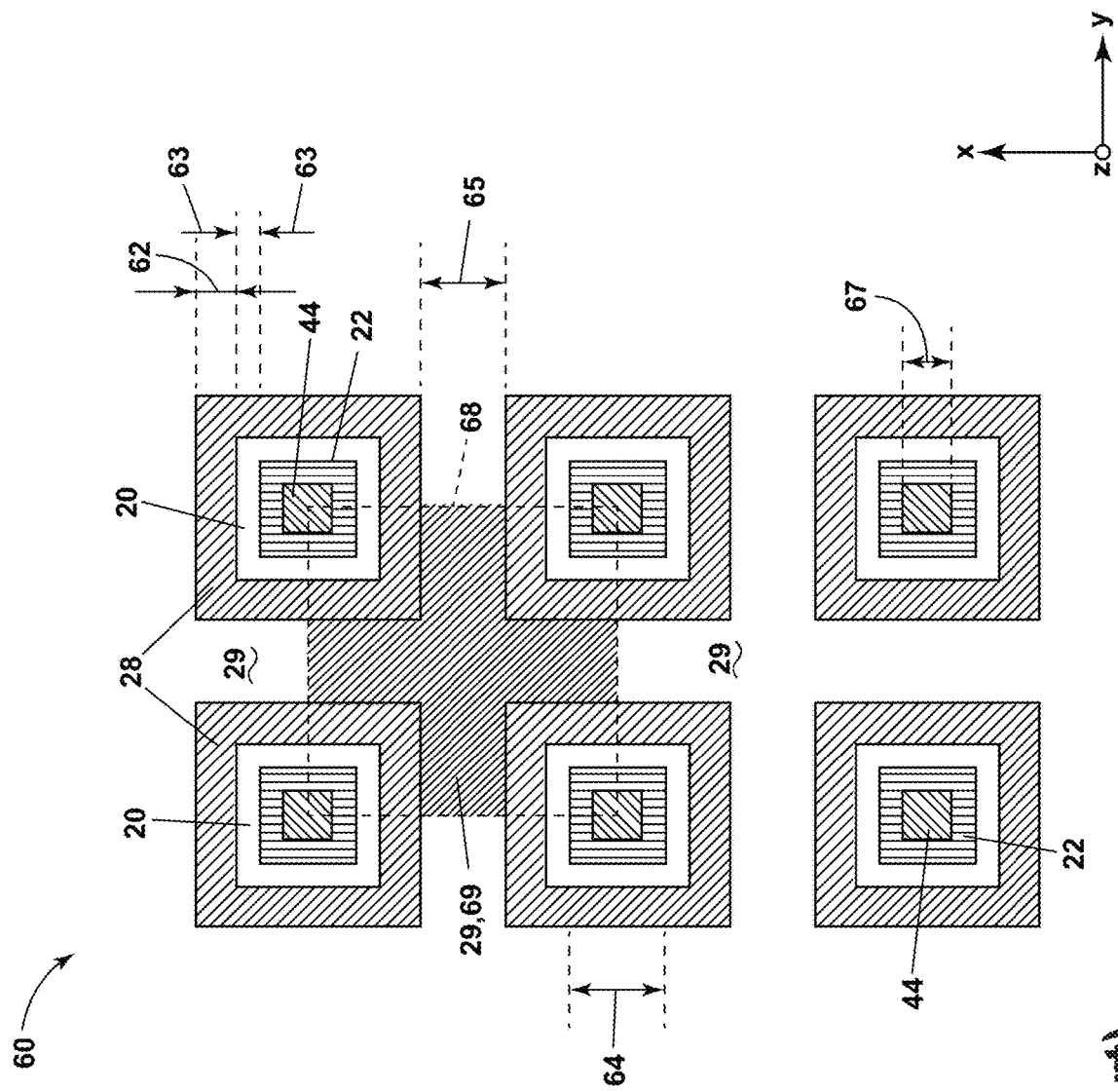
FIG. 6 is a top-down view of a surface of a SiC layer that includes a typical MOSFET device structure having a cellular layout.

For further comparison, another example of a conventional device layout is illustrated in FIG. 6, which is a top-down or plan view of a square cellular device layout 60 that does not include segmented source/body contacts. The square cellular device layout 60 includes: channel regions 28, source regions 20, body contact region 44, source contact 22, and JFET regions 29. FIG. 6 further illustrates dimensions of the square cellular device layout 60, including: channel length (Lch 62), distance from the channel to the ohmic region (Lch-to-ohm) 63, width of the ohmic region (Wohm) 64, width of the JFET region (WJFET) 65, width of the body contact region (Wp) 67, device cell area (Acell represented by the dashed rectangle 68), JFET area per cell (AJFET) represented by the cross-hatched area 69, for the illustrated cell of the square cellular device layout 60.

While the device layouts illustrated in FIG. 6 may enable lower Rds(on) relative to a stripe cell layout, as illustrated in FIG. 3, it is recognized that such designs can have a substantially higher electric field in portions of the JFET region 29 between the corners of the well regions 18 of neighboring device cells under blocking conditions. For SiC MOS devices, the electric field in the dielectric layer 24 (e.g., SiO2) disposed over the JFET region 29 (illustrated in FIGS. 1 and 2) can be around ten times higher compared to that in Si devices when the device cells operate under reverse bias. While SiC is generally robust toward higher electric fields, the dielectric layer 24 may experience breakdown during long term operation, resulting in reliability issues with the SiC device cells.

With the foregoing in mind, present embodiments are directed toward semiconductor device designs and layouts that enable improved semiconductor device performance. In particular, to reduce or minimize device on-state conduction losses (e.g., minimize Rds(on)) aspects as described herein can advantageously reduce the resistance of the components of the MOSFET device. For example, non-limiting aspects can include cellular device designs and layouts that provide increased channel width or increased channel density over conventional designs to reduce the channel resistance (Rch 32) and, thereby, reduce on-state conduction losses. It may be appreciated that, as used herein, the term, "channel density" can refer to the ratio of the length of a channel periphery of a particular device cell to the total area of the device cell. As such, for the aspects described and illustrated herein, the channel density may be equal to the total channel perimeter of one device cell divided by the area of the device cell. As described in more detail below, the non-limiting aspect as described herein enable the reduction of device pitch, and thus, increases channel periphery per unit area or increases density of the channel region 28 for the MOSFET device.

Figure 7:
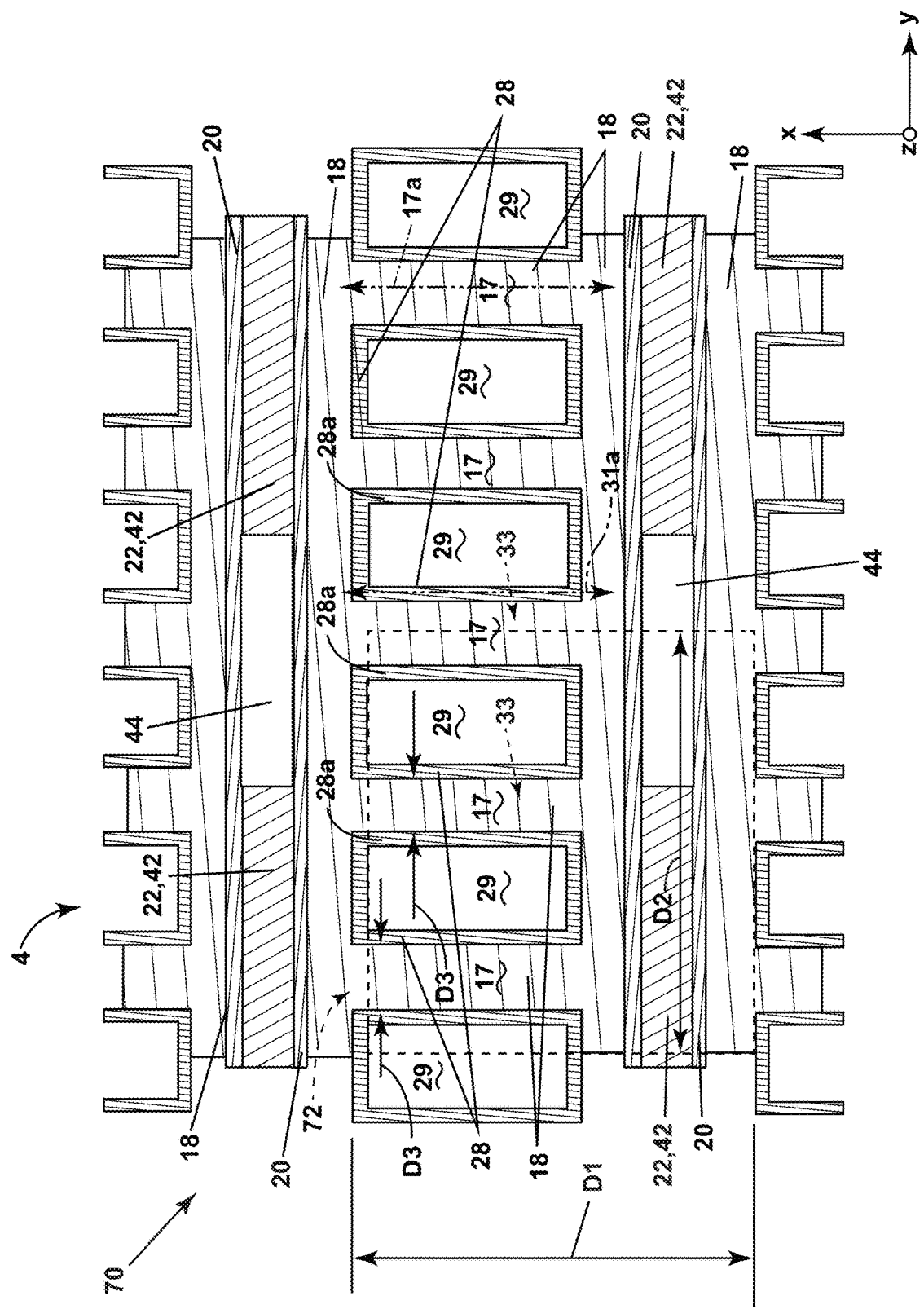
FIG. 7 is a top-down view of a system comprising an array of semiconductor device cells in in accordance with various aspects described herein.

FIG. 7 depicts a top-down or plan view illustrating a system 70 (e.g., a cellular semiconductor device such as a MOSFET) comprising an array of semiconductor device cells 72 in accordance with a non-limiting aspect. As described in more detail herein, the semiconductor device cells 72 can be configured to enable a reduced on-state resistance Rds(on) of the MOSFET device 10. Each semiconductor device cell 72 can be disposed at the first surface 4 of a semiconductor layer 2 (e.g., a silicon carbide (SiC) semiconductor layer). The semiconductor device cell 72 can define a vertical pitch or first axial length D1 extending across the extent of the first surface 4 of the semiconductor device cell 72, for example along the x-axis. The semiconductor device cell 72 can also define a horizontal pitch or second axial length D2 extending across the extent of the first surface 4 of the semiconductor device cell 72 orthogonal to the first axial length D1, for example along the y-axis. It will be appreciated that an area of the semiconductor device cell 72 can be determined based on the product of first axial length D1 and the second axial length D2.

In non-limiting aspects, the body contact region 44 of the semiconductor device cell 72 can be surrounded by a source region 20 of the first conductivity type (e.g. an n-type. or a p-type. A periphery of the source region 20 can be surrounded by a well region 18 of the second conductivity type. It may be appreciated that, portions of the source region 20 disposed below the source contact 22 serve as portions of the source contact region 42 of the semiconductor device cell 72. The semiconductor device cell 72 can include a drift region 16 having the first conductivity type.

A well region 18 having a second conductivity type (e.g. an p-type. or an n-type) can be disposed adjacent to the drift region 16. In aspects, the well region 18 can comprise a set of elongate well region segments 17 spaced from each other. Each well region segment 17 can define a respective well region segment longitudinal axis 17a. For example, as illustrated, in some aspects the respective well region segment longitudinal axes 17a can extend across the first surface 4, for example along the x-axis. In non-limiting aspects, two or more well region segment longitudinal axes 17a can be generally parallel with each other. In non-limiting aspects, the well region segment longitudinal axes 17a can be generally parallel with the first axial length D1. The source region 20 can be disposed immediately adjacent to the well region 18 and surrounded by the well region 18.

A channel region 28 having the second conductivity type can be disposed proximal to the first surface 4. The channel region 28 can comprise a set of elongate channel region segments 28a spaced from each other. In non-limiting aspects, the channel region segments 28a can define a periphery of the channel region 28. Each channel region segment 28a can define a respective channel region segment longitudinal axis 31. As illustrated, in some aspects the respective channel region segment longitudinal axes 31 can extend across the first surface 4, for example along the x-axis. In this sense, the respective channel region segment longitudinal axes 31 can be parallel to the first axial length D1. In non-limiting aspects, two or more channel region segment longitudinal axes 31 can be generally parallel with each other. Additionally, in some aspects, two or more channel region segment longitudinal axes 31 can be generally parallel with two or more well region segment longitudinal axes 17a. In non-limiting aspects, a pair of immediately adjacent channel region segments 28a can be spaced apart from one another along their respective longitudinal axes 31, to define a gap 33 therebetween. Each gap 33 can define a respective third axial length D3 orthogonal to the respective channel region segment longitudinal axes 31. In aspects, the third axial length D3 can be substantially orthogonal to the first axial length D1. In non-limiting aspects, a respective well region segment 17 can be disposed within the gap 33, and the well respective well region segment longitudinal axis 17a can be parallel to the respective channel region segment longitudinal axes 31.

Additionally, the channel region segments 28a can be at least partially surrounded by the well region 18. For example, in non-limiting aspects, a periphery of the channel region segments 28a can be cooperatively surrounded by a respective well region segment 17 and the drift region 16. As illustrated in FIG. 7, a periphery of the set of channel region segments 28a, the set of well region segments 17, and portions of the field-effect transistor (JFET) region 29 can be arranged to define a series of alternating substantially parallel elongate bands or stripes. Thus, non-limiting aspects can increase the density of the conducting channel region 28 per unit cell area over conventional techniques.

In non-limiting aspects, the body contact region 44 having the second conductivity type can be disposed over a portion of the well region 18. In non-limiting aspects, the body contact region 44 can be disposed substantially in the center of a plane of the source region 20 defined by the first surface 4.

In non-limiting aspects, the well region 18, source region 20, and channel region 28 can cooperatively or cumulatively define the first axial length D1 or pitch extending across the first surface 4 of the semiconductor device cell 72. In non-limiting aspects, the first axial length D1 can be substantially parallel with the channel region segment longitudinal axes 31 or the well region segment longitudinal axes 17a, or both. In aspects, the first axial length D1 can span substantially an entire length of the first surface 4 of the semiconductor device cell 72. In non-limiting aspects, each well region segment 17 can define the respective third axial length D3 or pitch extending across the surface 4, for example along the y-axis. In non-limiting aspects, the third axial length D3 can be arranged orthogonal to the first axial length D1.

In non-limiting aspects, the first axial length D1 can be within the range of 6 microns and 18 microns. In some non-limiting aspects, the third axial length D3 can be within the range of 0.3 microns to 1.6 microns. In still other non-limiting aspects, the relative dimensions of the first and third axial lengths D1, D3, the third axial length D3 can be within the range of between 5%-20% of the first axial length D1. Other aspects are not so limited, and the dimensions of the first axial length D1, or the third axial length D3, or both, can vary as desired for various applications without departing from the scope of the disclosure herein.

Regardless of the dimensions, or relative dimensions with respect to each other, or both, of the first and third axial lengths D1, D3, the specific dimensions the first and third axial lengths D1, D3 are arranged or defined with the particular purpose of decreasing the resistance contribution of the channel region 28 (i.e. the relatively higher resistance contribution of the inversion channel resistance), even at the expense of a relatively smaller consequent increase in the resistance contribution of the well region 18.

Figure 8:
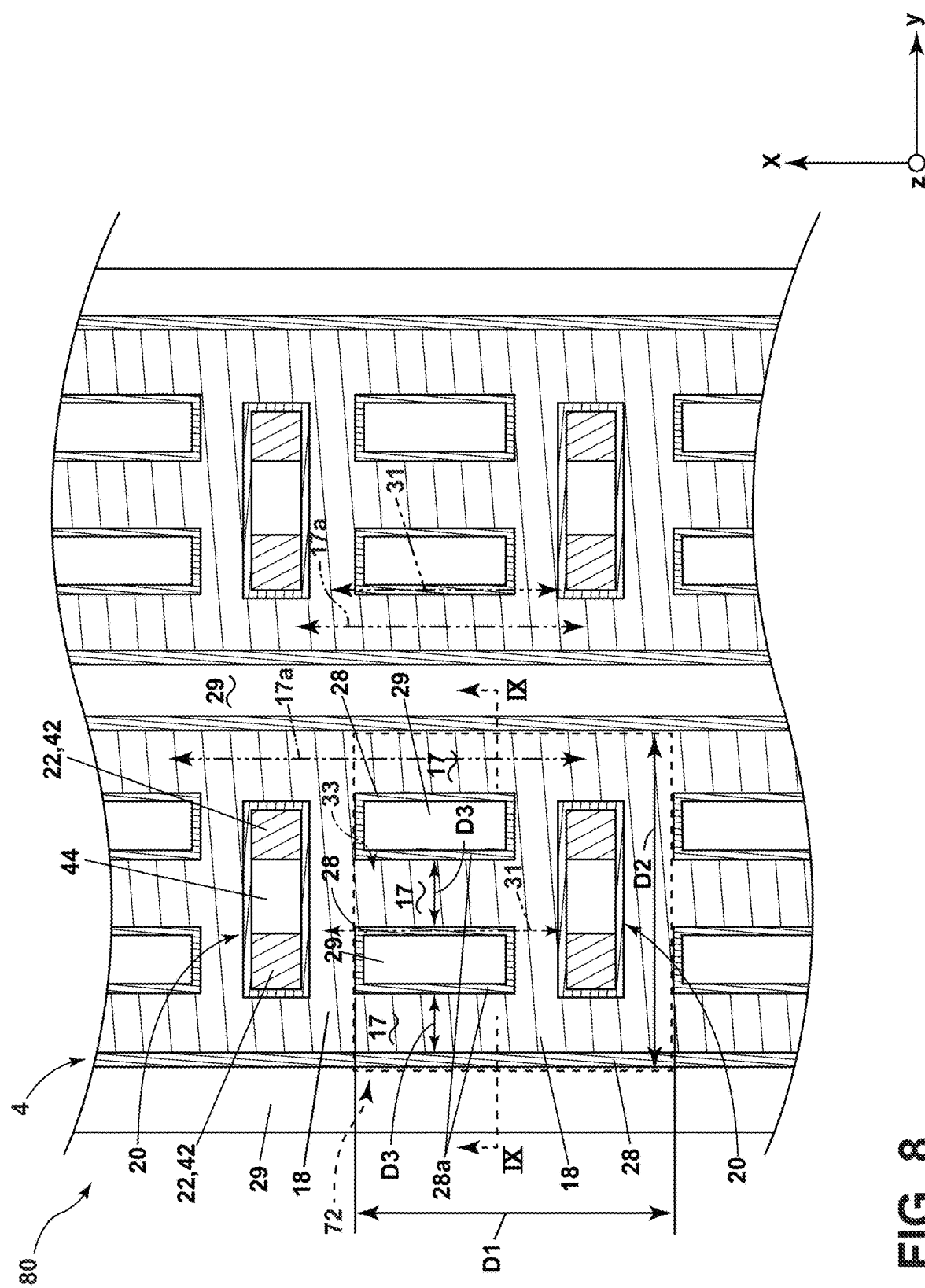
FIG. 8 is a top-down view of a system comprising an alternative array of semiconductor device cells in accordance with various aspects described herein.

FIG. 8 depicts a top-down or plan view illustrating an array of a system 80 including semiconductor device cells 72 in accordance with another non-limiting aspect. The non-limiting aspect of FIG. 8 is similar to the aspect depicted in FIG. 7, with one difference being that semiconductor device cells 72 are arranged in a cellular type layout. Simultaneous reference will also be made to FIG. 9 which depicts a cross-sectional view of the semiconductor device cells 72 of FIG. 8 taken along the line IX-IX.

Figure 9:
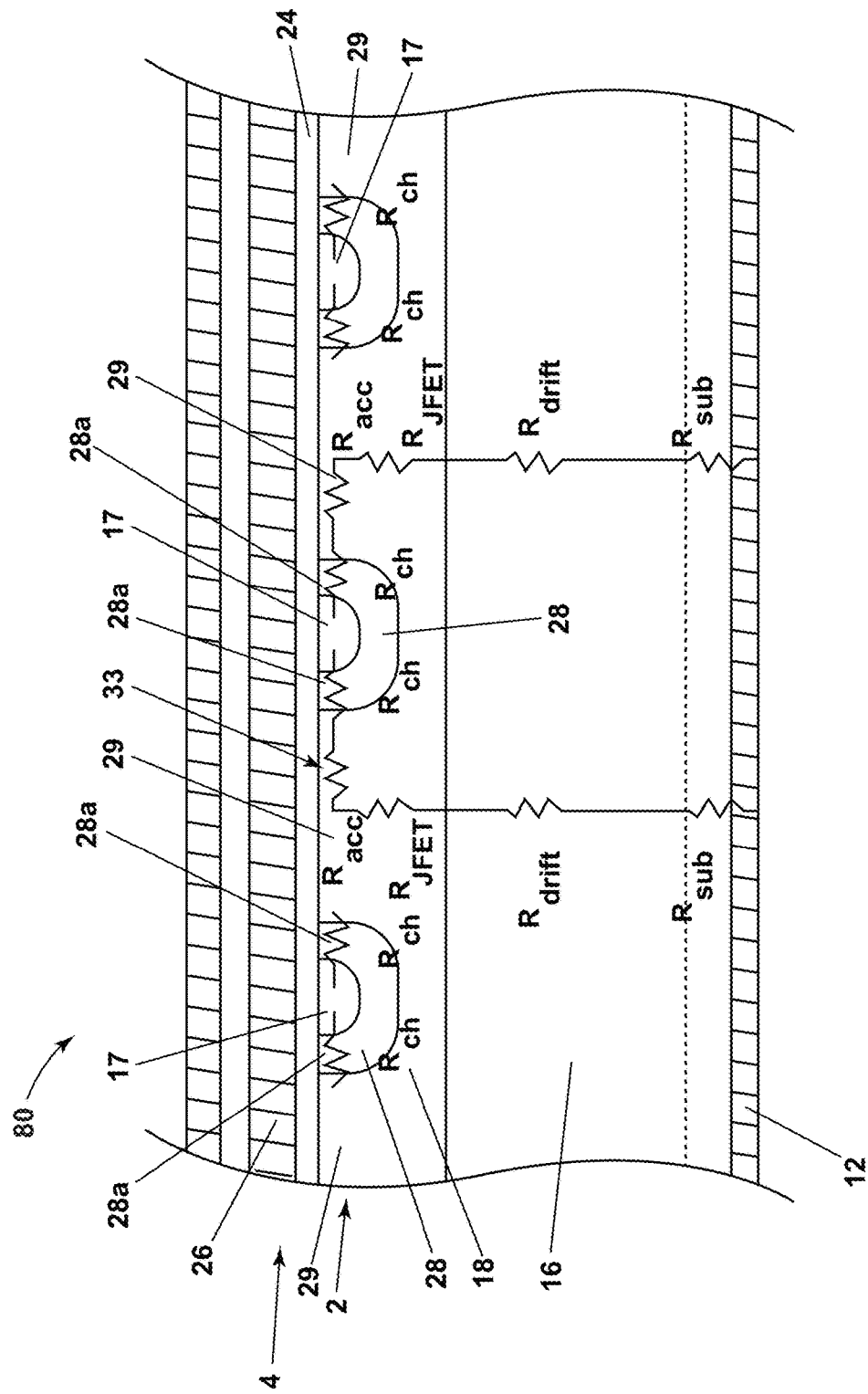
FIG. 9 is a cross-sectional view of the semiconductor device cells of FIG. 8.

In the non-limiting aspect illustrated in FIGS. 8 and 9, the semiconductor device cells 72 are configured to enable a reduced on-state resistance Rds(on) of the system 80. Each semiconductor device cell 72 is disposed at the first surface 4 of a semiconductor layer 2 (e.g., a SiC semiconductor layer 2). The semiconductor device cell 72 can define the vertical pitch or first axial length D1 extending across the extent of the first surface 4 of the semiconductor device cell 72, for example along the x-axis.

The dielectric layer 24 (e.g., the gate insulating layer) is disposed on a portion of the first surface 4 of the semiconductor layer 2, and the gate electrode 26 is disposed on the dielectric layer 24. The body contact region 44 of the semiconductor device cell 72 is surrounded by the source region 20 of the first conductivity type (e.g. an n-type. or a p-type). A periphery of the source region 20 of the first conductivity type can be surrounded by a well region 18 of the second conductivity type. Portions of the source region 20 disposed below the source contact 22 can serve as portions of the source contact region 42 of the semiconductor device cell 72. The semiconductor device cell 72 can include the drift region 16 having the first conductivity type.

The well region 18 having a second conductivity can be disposed adjacent to the drift region 16. In aspects, the well region 18 can comprise the set of elongate well region segments 17 spaced from each other and defining the respective well region segment longitudinal axes 17a. In non-limiting aspects, each well region segment longitudinal axis 17a can be generally parallel with each other. In non-limiting aspects, the well region segment longitudinal axes 17a can be generally parallel with the first axial length D1. The source region 20 is disposed immediately adjacent to the well region 18 and surrounded by the well region 18.

The channel region 28 having the second conductivity type can be disposed proximal to the first surface 4. The channel region 28 comprises a set of elongate channel region segments 28a spaced from each other and defining a respective channel region segment longitudinal axis 31. In non-limiting aspects, each channel region segment longitudinal axis 31 can be generally parallel with each other. In some aspects, the respective channel region segment longitudinal axes 31 can extend across the first surface 4, for example along the x-axis. In this sense, the respective channel region segment longitudinal axes 31 can be parallel to the first axial length D1. Additionally, in some aspects, each channel region segment longitudinal axis 31 can be generally parallel with the well region segment longitudinal axes 17a.

In non-limiting aspects, one or more respective channel region segments 28a can be spaced apart from another immediately adjacent channel region segment 28a to define a gap 33 therebetween. Each gap 33 can define a respective third axial length D3 orthogonal to the respective channel region segment longitudinal axes 31. In aspects, the third axial length D3 can be substantially orthogonal to the first axial length D1. In non-limiting aspects, a respective well region segment 17 can be disposed within the gap 33, such that the respective well region segment longitudinal axis 17a can be parallel to the respective channel region segment longitudinal axes 31. A periphery of the channel region segments 28a can be at least partially surrounded by the well region 18. For example, in non-limiting aspects, the channel region segments 28a can be cooperatively surrounded by a respective well region segment 17 and the drift region 16. As illustrated in FIG. 8, the set of channel region segments 28a, the set of well region segments 17, and portions of the drift region 16 can be arranged to define a series of alternating substantially parallel bands or stripes. In this sense, as illustrated in FIG. 8, the semiconductor device cell 72 may be described as having the well region segments 17 disposed on opposite sides of the channel region segments 28a. Thus, non-limiting aspects can minimize cell size and increase the density of the conducting channel region 28 per unit cell.

In some non-limiting aspects, the body contact region 44 having the second conductivity type can be disposed over a portion of the well region 18. The body contact region 44 can be disposed substantially in the center of a plane of the source region 20 defined by the first surface 4.

In non-limiting aspects, the well region 18, source region 20, and channel region 28 can cooperatively or cumulatively define the first axial length D1 or pitch extending across the first surface 4 of the semiconductor device cell 72. In non-limiting aspects, the first axial length D1 can be substantially parallel with the channel region segment longitudinal axes 31 or the well region segment longitudinal axes 17a, or both. In aspects, the first axial length D1 can span substantially an entire length of the first surface 4 of the semiconductor device cell 72. In non-limiting aspects, each well region segment 17 can define the respective third axial length D3 or pitch extending across the surface 4, for example along the y-axis. In non-limiting aspects, the third axial length D3 can be arranged orthogonal to the first axial length D1.

In non-limiting aspects, the first axial length D1 can be within the range of 6 microns and 18 microns. In some non-limiting aspects, the third axial length D3 can be within the range of 0.3 microns to 1.6 microns. In still other non-limiting aspects, the relative dimensions of the first and third axial lengths D1, D3, the third axial length D3 can be within the range of 5%-20% of the first axial length D1. Other aspects are not so limited, and the dimensions of the first axial length D1, or the third axial length D3, or both, can vary as desired for various applications without departing from the scope of the disclosure herein.

Regardless of the dimensions, or relative dimensions with respect to each other, or both, of the first and third axial lengths D1, D3, the specific dimensions the first and third axial lengths D1, D3 are arranged or defined with the particular purpose of decreasing the resistance contribution of the channel region 28 (i.e. the relatively higher resistance contribution of the inversion channel resistance), even at the expense of a relatively smaller consequent increase in the resistance contribution of the well region 18. Additionally, the illustrated semiconductor device cell 72 may be described as having portions of the well region 18 disposed on opposite sides of the channel region segments 28a. Thus, non-limiting aspects can minimize cell size and increase the density of the conducting channel region 28 per unit cell.

Thus, the presently disclosed semiconductor device cell 72 minimizes cell size and increases density of conducting regions (e.g., channel) per unit cell. In particular, present aspects reduce device conduction losses (e.g., minimize Rds(on)) by providing increased channel width and/or increased channel density to reduce the channel resistance.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The features disclosed in the foregoing description, in the following claims and/or in the accompanying drawings may, both separately and in any combination thereof, be material for realizing embodiments in diverse forms thereof.

Various characteristics, aspects and advantages of the present disclosure may also be embodied in any permutation of aspects of the disclosure, including but not limited to the following technical solutions as defined in the enumerated aspects:

1. A semiconductor device cell (72) having comprising: a semiconductor layer (2) including a drift region (16) having a first conductivity type; a well region (18) having a second conductivity type disposed proximal to a surface (4) of the semiconductor layer (2) the well region (18) defining a set of well region segments (17); a source region (20) having the first conductivity type disposed adjacent to the well region (18), a periphery of the source region (20) surrounded by the well region (18); a channel region (28) having the second conductivity type, and proximal to the surface (4) of the semiconductor layer (2), the channel region (28) defining a set of channel region segments (28a) a periphery of the set of channel region segments (28a) being surrounded by the well region (18); and wherein the well region (18), source region (20), and channel region (28) cooperatively define a first axial length (D1) extending across the surface (4).
2. The semiconductor device cell (72) of any preceding clause, further comprising a JFET region, wherein a portion of the JFET region is surrounded by the channel region.
3. The semiconductor device cell (72) of any preceding clause, wherein a pair of immediately adjacent channel region segment (28a) are spaced apart from each other to define a gap (33) therebetween, the gap (33) defining a respective third axial length (D3), orthogonal to the first axial length (D1), wherein a respective well region segment (17) is disposed within the gap (33).
4. The semiconductor device cell (72) of any preceding clause, wherein the first axial length (D1) is within a range of 6 microns and 18 microns.
5. The semiconductor device cell (72) of any preceding clause, wherein the third axial length (D3) is within a range 0.3 microns to 1.6 microns.
6. The semiconductor device cell (72) of any preceding clause, wherein the third axial length (D3) is within the range of 8%-15% of the first axial length (D1).
7. The semiconductor device cell (72) of any preceding clause, wherein each respective channel region segment (28a) defines a respective first longitudinal axis (31), and each well region segment (17) defines a respective second longitudinal axis (17a), wherein the first and second longitudinal axes (31), (17a) are parallel with each other.
8. The semiconductor device cell (72) of any preceding clause further comprising a body contact region (44) having the second conductivity type disposed over a portion of the well region (18), wherein the body contact region (44) is disposed substantially in the center of a plane of the source region (20) defined by the surface (4).

9. The semiconductor device cell (72) of any preceding clause, wherein the set of channel region segments (28a), the set of well region segments (17), and portions of the drift region (16) are arranged to define a series of alternating substantially parallel bands.

10. The semiconductor device cell (72) of any preceding clause, wherein the semiconductor device cell (72) is a MOSFET (70).

11. A system (70), (80) comprising: a set of semiconductor device cells (72) disposed at a surface (4) of a silicon carbide (SiC) semiconductor layer (2);

wherein the set of semiconductor device cells (72) each comprise: a semiconductor layer (2) including a drift region (16) having a first conductivity type;

a well region (18) having a second conductivity type disposed proximal to a surface (4) of the semiconductor layer (2), the well region defining a set of well region segments (17); a source region (20) having the first conductivity type disposed adjacent to the well region (18), a periphery of the source region (20) surrounded by the well region (18); a channel region (28) having the second conductivity type, and proximal to the surface (4), the channel region (28) defining a set of channel region segments (28a), a periphery of the set of channel region segment (28a) being surrounded by the well region (18); and wherein the well region (18), source region (20), and channel region (28) cooperatively define a first axial length extending across the surface (4).

12. The system (70), (80) of any preceding clause, further comprising a JFET region, wherein a portion of the JFET region is surrounded by the channel region.

13. The system (70), (80) of any preceding clause, wherein each respective channel region segment (28a) is spaced apart from another immediately adjacent channel region segment (28a) to define a gap (33) therebetween, the gap (33) defining a respective third axial length (D3), orthogonal to the first axial length (D1), wherein a respective well region segment (16) is disposed within the gap (33).

14. The system (70), (80) of any preceding clause, wherein the first axial length (D1) is within a range of 6 microns and 18 microns.

15. The system (70), (80) of any preceding clause, wherein the third axial length (D3) is within a range 0.3 microns to 1.6 microns.

16. The system (70), (80) of, wherein the third axial length (D3) is within the range of 5%-20% of the first axial length (D1).

17. The system (70), (80) of any preceding clause, wherein each respective channel region segment (28a) defines a respective first longitudinal axis (31), and each well region segment (17) defines a respective second longitudinal axis (17a), wherein the first and second longitudinal axes (31), (17a) are parallel with each other.

18. The system (70), (80) of any preceding clause, further comprising a body contact region (44) having the second conductivity type disposed over a portion of the well region (18), wherein the body contact region (44) is disposed substantially in the center of a plane of the source region (20) defined by the surface (4).

19. The system (70), (80) of any preceding clause, wherein the set of channel region segments (28a), the set of well region segments (17), and portions of the drift region (16) are arranged to define a series of alternating substantially parallel bands.

20. The system (70), (80) of any preceding clause, wherein the set of semiconductor device cells (72) define a MOSFET.

What is claimed is:

1. A semiconductor device cell having comprising:
a semiconductor layer including a drift region having a first conductivity type;
a well region having a second conductivity type disposed proximal to a surface of the semiconductor layer the well region defining a set of well region segments;
a source region having the first conductivity type disposed adjacent to the well region, a periphery of the source region surrounded by the well region;
a channel region having the second conductivity type, and proximal to the surface of the semiconductor layer, the channel region defining a set of channel region segments a periphery of the set of channel region segments being surrounded by the well region; and
wherein the well region, source region, and channel region cooperatively define a first axial length extending across the surface;
wherein a pair of immediately adjacent channel region segments are spaced apart from each other to define a gap therebetween, wherein a respective well region segment is disposed within the gap; and
wherein a portion of the channel region extends across an entire length of a periphery of the cell parallel to the first axial length.

2. The semiconductor device cell of claim 1, further comprising a JFET region, wherein a portion of the JFET region is surrounded by the channel region.

3. The semiconductor device cell of claim 1, wherein the gap defines a respective third axial length, orthogonal to the first axial length.

4. The semiconductor device cell of claim 3, wherein the first axial length is within a range of 6 microns and 18 microns.

5. The semiconductor device cell of claim 4, wherein the third axial length is within a range 0.3 microns to 1.6 microns.

6. The semiconductor device cell of claim 4, wherein the third axial length is within the range of 8%-15% of the first axial length.

7. The semiconductor device cell of claim 1, wherein each respective channel region segment defines a respective first longitudinal axis, and each well region segment defines a respective second longitudinal axis, wherein the first and second longitudinal axes are parallel with each other.

8. The semiconductor device cell of claim 1, further comprising a body contact region having the second conductivity type disposed over a portion of the well region, wherein the body contact region is disposed substantially in the center of a plane of the source region defined by the surface.

9. The semiconductor device cell of claim 1, wherein the set of channel region segments, the set of well region segments, and portions of the drift region are arranged to define a series of alternating substantially parallel bands.

10. The semiconductor device cell of claim 1, wherein the semiconductor device cell is a MOSFET.

11. A system comprising:
a set of semiconductor device cells disposed at a surface of a silicon carbide (SiC) semiconductor layer;
wherein the set of semiconductor device cells each comprise:
a semiconductor layer including a drift region having a first conductivity type;

a well region having a second conductivity type disposed proximal to a surface of the semiconductor layer, the well region defining a set of well region segments;

a source region having the first conductivity type disposed adjacent to the well region, a periphery of the source region surrounded by the well region; and a channel region having the second conductivity type, and proximal to the surface of the semiconductor layer, the channel region defining a set of channel region segments, a periphery of the set of channel region segment being surrounded by the well region;

wherein the well region, source region, and channel region cooperatively define a first axial length extending across the surface;

wherein a pair of immediately adjacent channel region segments are spaced apart from each other to define a gap therebetween, wherein a respective well region segment is disposed within the gap; and wherein a portion of the channel region extends across an entire length of a periphery of the cell parallel to the first axial length.

12. The system of claim 11, further comprising a JFET region, wherein a portion of the JFET region is surrounded by the channel region.

13. The system of claim 11, wherein the gap defines a respective third axial length, orthogonal to the first axial length.

14. The system of claim 11, wherein the first axial length is within a range of 6 microns and 18 microns.

15. The system of claim 13, wherein the third axial length is within a range 0.3 microns to 1.6 microns.

16. The system of claim 13, wherein the third axial length is within a range of 5%-20% of the first axial length.

17. The system of claim 11, wherein each respective channel region segment defines a respective first longitudinal axis, and each well region segment defines a respective second longitudinal axis, wherein the first and second longitudinal axes are parallel with each other.

18. The system of claim 11, further comprising a body contact region having the second conductivity type disposed over a portion of the well region, wherein the body contact region is disposed substantially in the center of a plane of the source region defined by the surface.

19. The system of claim 11, wherein the set of channel region segments, the set of well region segments, and portions of the drift region are arranged to define a series of alternating substantially parallel bands.

20. The system of claim 11, wherein the set of semiconductor device cells define a MOSFET.

* * * * *